US007983071B2

(12) United States Patent      (10) Patent No.: US 7,983,071 B2
Houston      (45) Date of Patent: Jul. 19, 2011

(54) DUAL NODE ACCESS STORAGE CELL HAVING BUFFER CIRCUITS

(75) Inventor: Theodore Warren Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 48 days.

(21) Appl. No.: 12/209,657

(22) Filed: Sep. 12, 2008

(65) Prior Publication Data

US 2009/0175070 A1     Jul. 9, 2009

Related U.S. Application Data

(60) Provisional application No. 61/019,024, filed on Jan. 4, 2008, provisional application No. 61/019,028, filed on Jan. 4, 2008, provisional application No. 61/019,020, filed on Jan. 4, 2008.

(51) Int. Cl.
     *G11C 11/00*      (2006.01)
(52) U.S. Cl. ............... 365/154; 365/189.05; 365/189.07
(58) Field of Classification Search ............. 365/154 O, 365/189.05 X, 89.07 X, 154, 189.05, 189.07
See application file for complete search history.

(56) References Cited

U.S. PATENT DOCUMENTS

| | | | | |
|---|---|---|---|---|
| 6,765,817 | B2 * | 7/2004 | Takemura | 365/154 |
| 7,123,504 | B2 * | 10/2006 | Yabe | 365/156 |
| 7,164,596 | B1 | 1/2007 | Deng et al. | |
| 7,239,538 | B2 * | 7/2007 | Asayama et al. | 365/154 |
| 7,313,032 | B2 * | 12/2007 | Ellis et al. | 365/189.09 |
| 7,460,408 | B2 * | 12/2008 | Yabe | 365/185.23 |
| 2007/0279966 | A1 | 12/2007 | Houston | |

OTHER PUBLICATIONS

Ted Houston, U.S. Appl. No. 12/209,418, "Storage Cell Having Buffer Circuit for Driving the Bitline ," filed Sep. 12, 2008.
Ted Houston et al., U.S. Appl. No. 12/209,456, "Memory Cell Layout Structure with Outer Bitline ," filed Sep. 12, 2008.

* cited by examiner

*Primary Examiner* — VanThu Nguyen
(74) *Attorney, Agent, or Firm* — Rose Alyssa Keagy; Wade J. Brady, III; Frederick J. Telecky, Jr.

(57) ABSTRACT

An integrated circuit includes an array of memory cells, each including a core storage element with first and second complementary storage nodes and first and second cell pass transistors coupled to the first and second storage nodes, respectively. In the cell, a first bitline (BL) is coupled to a first BL node in a source drain path of the first cell pass transistor, and a second BL is coupled to a second BL node in a source drain path of the second cell pass transistor. Each of the memory cells also includes a first buffer circuit comprising a first buffer pass transistor and a first driver transistor coupled to the source drain path of the first cell pass transistor, where the first buffer pass transistor is between the first BL node and the first driver transistor. The memory cells also include a second buffer circuit comprising a second buffer pass transistor and a second driver transistor coupled to a source drain path of the second cell pass transistor, where the second buffer pass transistor is between the second BL node and the second driver transistor. The gates of the first and second driver transistors are coupled to the second and first storage nodes, respectively. The cells include at least a first wordline coupled to the first and second cell pass transistors and the first and second buffer pass transistors.

18 Claims, 15 Drawing Sheets

DUAL NODE ACCESS STORAGE CELL HAVING BUFFER CIRCUITS

CROSS REFERENCE TO RELATED APPLICATION

This application claims the benefit of Provisional Application Ser. No. 61/019,024 entitled "10T SRAM Cell with 1 WL and 2 BL's (BL and BL)", filed Jan. 4, 2008, Provisional Application Ser. No. 61/019,028 entitled: "7T SRAM CELL WITH 1 WL AND 1 BL", filed Jan. 4, 2008, and Provisional Application Ser. No. 61/019,020 entitled: "METHOD FOR ACCELERATING MONTE CARLO EVALUATIONS, AND CIRCUITS DESIGNED BY THIS METHOD", filed Jan. 4, 2008 which are all herein incorporated by reference in their entireties.

FIELD OF INVENTION

The present invention relates generally to semiconductor memory devices and more particularly integrated circuits having dual node access memory cells that include buffer circuitry storage element of the memory cells.

BACKGROUND

The basic CMOS 6T SRAM cell generally includes two n-type or n-channel (NMOS) pull-down or drive transistors and two p-type (PMOS) pull-up or load transistors in a cross-coupled inverter configuration, with two additional NMOS select or pass-gate transistors added to make up a standard double-sided or differential six-transistor memory cell (a DS 6T SRAM cell, a 6T SRAM cell, or simply a 6T cell). A 10T cell comprises a 6T cell together with two "read buffers" coupled to the 6T cell, wherein each read buffer comprises a series connected read pass transistor and a read driver transistor.

There is a general need for a stable compact memory cells with high READ current (Iread) per area, that operates at low power (e.g. low Quiescent supply current (IDDQ), that are stable during a read operation and can be reliably written into. However, these characteristics generally contradict one another. For example, low Vt and/or short gate lengths generally provide high Iread, but also result in high subthreshold leakage and poor cell stability. Longer channel lengths and/or higher voltage thresholds (Vt) reduce subthreshold leakage and improve cell stability but degrade Iread, especially at low VDD. Similarly, changes in the transistors (such as width, length, or threshold voltage) that improve the stability during a READ generally degrades the robustness of the WRITE.

Both 8T and 10T SRAM cells comprising a 6T core SRAM cell and a read buffers with separate read wordline (WL) and separate read bitline (BL) have been proposed to separate read functionality from write functionality. However, this separation of read functionality and write functionality of these conventional 8T and 10T cells are not effective in conventional SRAM architectures where words are interleaved in a row. Cells that are in a selected row but not a selected column (half selected cells) are subject to upset in a WRITE cycle. This upset of half selected cells can be remedied by READ and WRITE back, but additional peripheral circuitry is needed to sense the read bit lines (RBL) and drive the write bit lines (WBL) for half selected cells in a WRITE cycle.

An alternative prior art 10T uses a cross-point selection of addressed cells with a word line and a column select line, both of which must be asserted for WRITE access to the selected cell. This prior art 10T eliminates the half-selected cell problem, but is not amenable to building a compact cell and array.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

An integrated circuit (IC) including at least one memory cell comprising a core storage element having a first storage node and a complementary second storage node, a first cell pass transistor coupled to the first storage node, and a second cell pass transistor coupled to the second storage node. In the memory cell, a first bitline (BL) is coupled to a first BL node in a source drain path of the first cell pass transistor and a second BL is coupled to a second BL node in a source drain path of the second cell pass transistor. The memory cell also comprises a first buffer circuit comprising a first buffer pass transistor and a first driver transistor coupled to the source drain path of the first cell pass transistor and where the first buffer pass transistor is between the first BL node and the driver transistor. The memory cell also includes a second buffer circuit comprising a second buffer pass transistor and a second driver transistor coupled to a source drain path of the second cell pass transistor, where the second buffer pass transistor is between the second BL node and the driver transistor. In the memory cell, the gates of the first driver transistor and the second driver are coupled to the second storage node and the first storage node, respectively. The memory cell further comprises at least a first wordline (WL) coupled to the first and second cell pass transistors and the first and second buffer pass transistors.

The core storage element can comprise a 4T DRAM, or an SRAM. In one embodiment, the first cell and buffer pass transistors are connected in series between the first storage node and the first driver transistor, and the BL is coupled to a node between the first cell and buffer pass transistors. Additionally, the second cell and buffer pass transistors are connected in series between the second storage node and the second driver transistor, and the $\overline{BL}$ is between the first cell and buffer pass transistors. In another embodiment, the first cell and buffer pass transistors are connected in series between the first storage node and the BL, and the first pass cell transistor is between the first driver transistor and said first storage node. Additionally, the second cell and buffer pass transistors can be connected in series between the second storage node and the $\overline{BL}$, and the second cell pass transistor between the second driver transistor and the second storage node.

DETAILED DESCRIPTION

Figure 1:
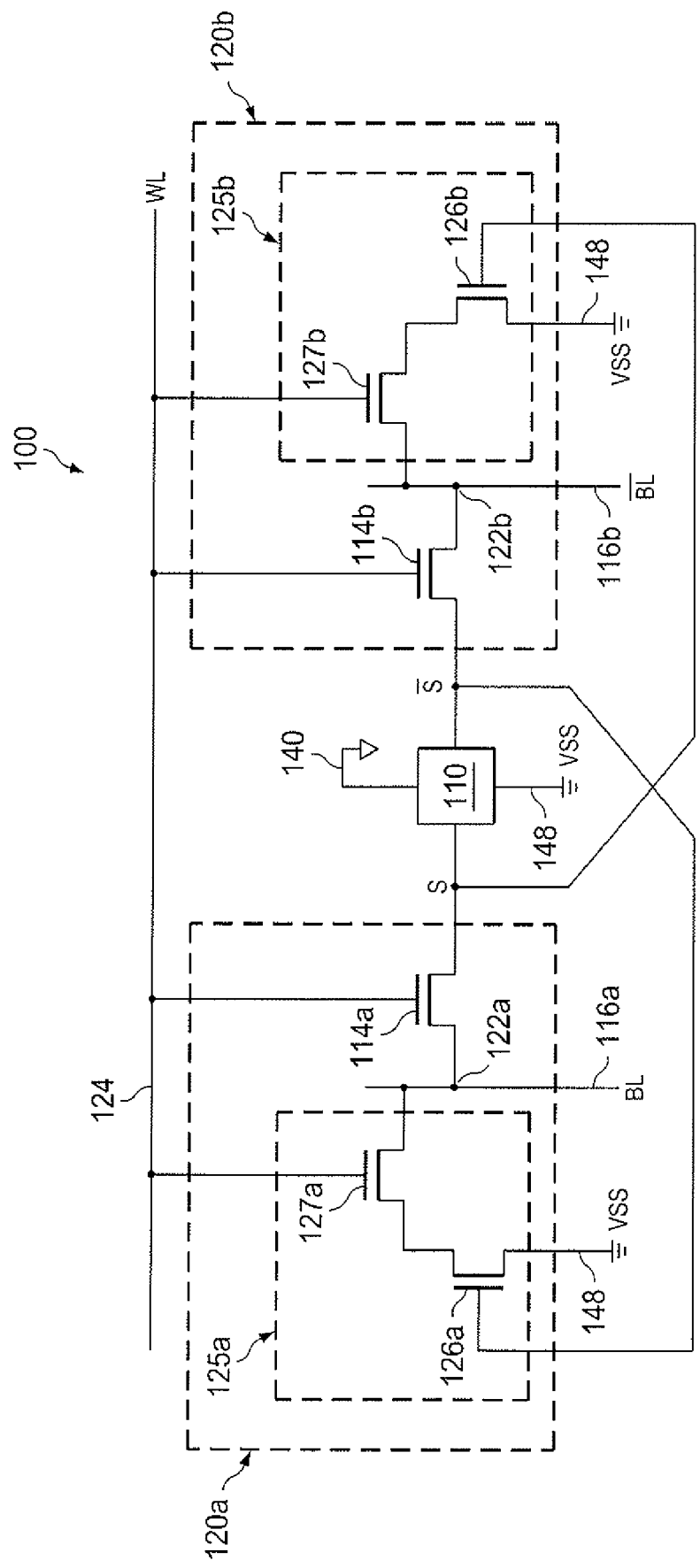
FIG. 1 is a schematic of a memory cell comprising a core storage element and buffer circuits each comprising a buffer pass transistor and a driver transistor, with common READ/WRITE BL's (BL and $\overline{BL}$) and a single READ/WRITE WL, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the invention include a new memory cell having a dual buffer circuits each comprising a buffer pass transistor and a driver transistor coupled to each of the storage nodes of a core storage element for driving the bit lines coupled to the storage node. Embodiments of the invention are generally applicable to core storage elements that have complementary first and second storage nodes, such as SRAMs and 4T-DRAMs, and which are accessible via either storage node. Each driver transistor is coupled to a first complementary storage node gated by the inverse voltage reflected on the second complementary storage node and vice versa.

FIG. 1 is a schematic of a memory cell 100 with complementary READ/WRITE BL's (BL and $\overline{BL}$) and a single READ/WRITE WL, according to an embodiment of the invention. Memory cell 100 includes a core storage element 110 which provides a first storage node (S), and a complementary second storage node ($\overline{S}$). Memory cell 100 is connected to a VDD drain voltage line 140 and a VDD source voltage line 148. A first cell pass transistor 114a is coupled to the first storage node S and a second cell pass transistor 114b is coupled to the second storage node $\overline{S}$.

Buffer circuits 125a and 125b each comprise a buffer pass transistor 127a, 127b and a driver transistor 126a, 126b, wherein the buffer pass transistors 127a, 127b are each between a respective driver transistor 126a, 126b and the source drain path of the respective cell pass transistor 114a, 114b. A gate of each of the driver transistors 126a, 126b is coupled to $\overline{S}$ and S, respectively. A wordline (WL) 124 is shown coupled to the cell pass transistors 114a, 114b and the buffer pass transistors 127a, 127b.

In a typical embodiments, each combination of a buffer pass transistor 127a, 127b and a driver transistor 126a, 126b provides one of the buffer circuits 125a and 125b for core storage element 110. Driver transistors 126a, 126b may be referred to as buffer driver transistors or buffer drivers. Driver transistor 126a and buffer pass transistor 127a, in combination, are operable to supply current to the BL 116a in parallel with current supplied by the core storage element 110 through cell pass transistor 114a. Similarly, driver transistor 126b and buffer pass transistor 127b in combination are operable to supply current to the $\overline{BL}$ 116b in parallel with current supplied by the core storage element 110 through pass gate 114b. Thus, the buffer circuits 125a and 125b assist in driving the BL 116a and the $\overline{BL}$ 116b, respectively, and reduces the probability of upset of the memory cell 100 when memory cell 100 is accessed.

A first READ/WRITE BL, shown as BL 116a, is coupled to a source drain path of the first cell pass transistor 114a for both reading and writing data to the first storage node S. As shown in FIG. 1, BL 116a is coupled to the node identified as BL node 122a, which is at a source/drain of first buffer pass transistor 127a and a source/drain of first cell pass transistor 114a. A second complementary READ/WRITE BL, shown as 116b, is coupled to a source drain path of the second cell pass transistor 114b for both reading and writing data to the second storage node. As shown in FIG. 1, 116b is coupled to the node identified as BL node 122b, which is at a source/drain of second buffer pass transistor 127b and a source/drain of second cell pass transistor 114b. It is noted that the source and drain of a pass transistor interchange according to the bias, and are thus different for READ versus WRITE. In either READ or WRITE, for a given bias condition the two nodes referred to would both be sources or both be drains. A common READ/WRITE WL 124 is shown coupled to the gate of the cell pass transistors 114a, 114b and to the gate of the buffer pass transistors 127a, 127b. However, as described below, embodiments of the invention also can include separate READ and WRITE WLs.

The coupling of the buffer pass transistors 127a and 127b (and thus respective buffer circuits 125a and 125b) to the same BL's as the cell pass transistors 114a and 114b, respectively, in memory cell 100, and thus the buffers 125a and 125b to storage nodes S and $\overline{S}$, respectively, provides a significant stability improvement over conventional memory cells which provide no such connection. A stability improvement results from each of buffer circuits 125a and 125b in this configuration being able to help discharge one of BL 116a and $\overline{BL}$ 116b during read operations. This faster discharge improves the dynamic stability of the memory cell 100.

In operation of cell 100 for READ, with both BL 116a and $\overline{BL}$ 116b pre-charged high and WL 124 asserted high, when the first storage node S is low (and the second storage node is high) the buffer 125a helps pull the associated BL 116a low, thus reducing the probability of upset. In this case, it can be seen that BL 116a is pulled low (to ground in FIG. 1) through first driver transistor 126a and buffer pass transistor 127a which are both on when the second storage node and WL 124 are high, respectively, and thus couples the BL 116a to VSS source voltage line 148 (at ground). This discharge path through the buffer circuit 125a is in addition to any BL discharge path through first cell pass transistor 114a and any components in the storage element 110. If the first buffer pass transistor 127a has lower Vt relative to the Vt of the first cell pass transistor 114a, as WL 124 ramps up, the buffer circuit 125a will start discharging the BL 116a before the first cell pass transistor 114a is turned on sufficiently for BL 116a to upset the core storage element 110. In either case, the BL 116a will discharge faster with the addition of the buffer circuit 125a as compared conventional cell designs. Furthermore, since the second buffer driver is off when the first storage node is low, no additional discharge path is provided for $\overline{BL}$ 116b, thus the pre-charged $\overline{BL}$ 116b reinforces the high at the second storage node and ensures that first buffer driver transistor remains on. Therefore, the buffer circuits 125a, 125b discharge one of BL 116 and $\overline{BL}$ 116b faster, adding greater stability to the memory cell 100 as compared to convention cell designs that lack buffer circuits 125a, 125b coupled to the storage nodes S and $\overline{S}$, respectively.

Embodiments of the invention thus generally solve the need for a memory cell that provides compactness, high READ current per area, and low power (e.g. low IDDQ). Embodiments of the invention also generally provide enhanced stability by taking advantage of dynamic effects for stability as described above.

In one embodiment of the invention, an integrated circuit comprises one or more memory arrays comprising a plurality of memory cells according to embodiments of the invention. In one embodiment, the memory cell comprises a 10T SRAM cell, which comprises a 6T SRAM core cell (a 4T SRAM core storage element and first and second cell pass transistors coupled to first and second storage nodes) and first and second buffer circuits coupled to the storage nodes of the 6T SRAM core cell. Each of the buffer circuits comprises a two (2) transistor buffer having an output coupled to one of the cell pass transistors of the core cell. In another embodiment, the 6T core cell can be replaced with a 4T core DRAM element. In still other embodiments, PMOS transistors can be used (e.g., the NMOS pass transistors are replaced with PMOS pass transistors) along with any necessary changes in the polarity of the voltages (e.g., WL is asserted by lowering, rather than raising, the WL voltage).

BL 116a and 116b are provided for both READ and WRITE of data to the storage nodes S and $\overline{S}$, respectively. In one embodiment of the invention, the memory cell can have a single wordline (WL) for both READ/WRITE instead of the separate READ/WRITE WL's of conventional memory cells with read buffers. In other embodiments of the invention, a low voltage power supply (e.g. VSS) for the buffer circuits can be separate from the low voltage supply coupled to the core storage element and thus provide a different supply voltage level as compared to the corresponding low power supply level that is provided to the core storage element. In particular, the low voltage supply to the buffer circuits can be floated in Standby to reduce leakage, and can be floated to the addressed (fully selected) cells in a WRITE operation to avoid contention of the buffer circuit with a write driver. Optionally, the VSS to the buffer circuits of the addressed cells in a WRITE cycle can be raised or lowered according to the data being written.

Figure 2A:
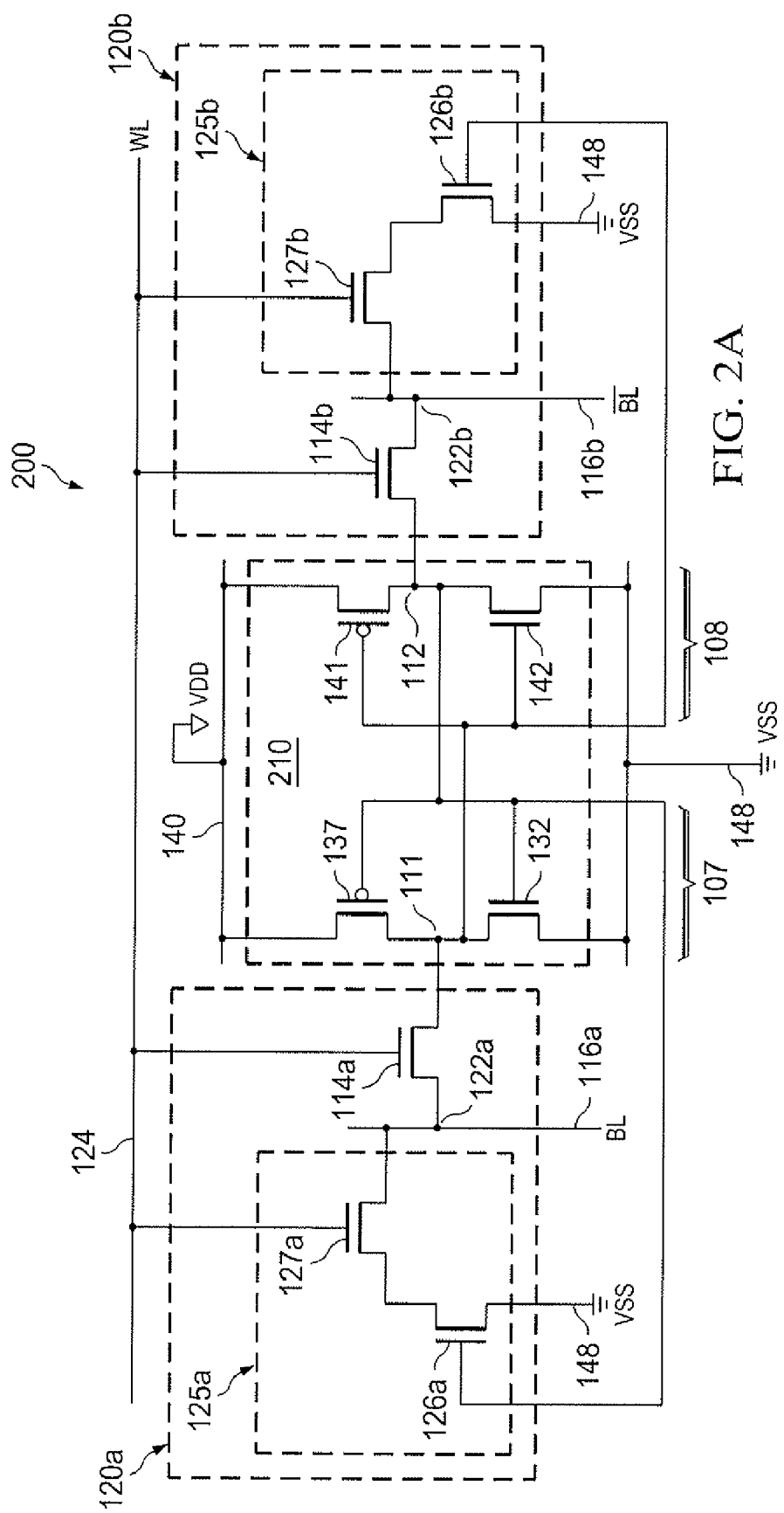
FIG. 2A is a schematic of a 10T cell with common READ/WRITE BL's (BL and $\overline{BL}$), and a common READ/WRITE WL, according to an embodiment of the invention.

FIG. 2A is a schematic of a 10T SRAM cell 200 with a dual READ/WRITE BL's (BL 116a and $\overline{BL}$ 116b) and a READ/WRITE WL, according to an embodiment of the invention. Memory cell 200 includes a 4T core storage element 210 which comprises conventional first and second cross-coupled inverters 107, 108. Respective inverters 107 and 108 comprise a p-type MOS (PMOS) pull-up or load transistor 131, 141 and an n-type MOS (NMOS) pull-down transistor 132, 142. The first inverter 107 has a first storage (latched data) node 111 and the second inverter has a second storage node 112. Inverters 107 and 108 of the SRAM core 210 are connected together to a VDD drain voltage line 140 and as VSS source voltage line 148. A first cell pass transistor 114a is coupled to the first storage node 111 and a second cell pass transistor 114b is coupled to the second storage node 112.

As described above relative to FIG. 1, the buffer circuits 125a, 125b, each of which comprise one of buffer pass transistors 127a, 127b and a respective one of series connected driver transistors 126a, 126a are coupled to BL 116a at node 122a and to $\overline{BL}$ 116b at node 122b, respectively. BL 116a is connected to storage node 111 by cell pass transistor 114a and $\overline{BL}$ 116b is coupled to $\overline{BL}$ 116b storage node 112 by cell pass transistor 114b. The combination of 4T core cell 210 and cell pass transistors 114a and 114b can be referred to as a 6T core storage element 210, 114. The gate of the driver 126a is shown coupled to the second storage node 112 and the gate of the driver transistor 126b is shown coupled to the first storage node 111.

The coupling of the buffer circuit 125a to the same BL 116a as to which storage node 111 is connected (via cell pass transistor 114a) and the coupling of buffer circuit 125b to the same $\overline{BL}$ 116b as to which storage node 112 is connected (via second cell pass transistor 114b) in the 10T memory cell 200, provides a significant stability improvement over conventional 10T cells which provide no such connection. The stability improvement results from the buffer circuits 125a and 125b in this configuration being able to help discharge one of BL 116 and $\overline{BL}$ 116b for read operations. This faster discharge of one of BL 116 and $\overline{BL}$ 116b improves the dynamic stability of the cell 200.

In operation of cell 200 for READ, BL 116a and $\overline{BL}$ 116b are both pre-charged high and WL 124 is asserted high. Therefore, when the first storage node 111 is low (and second storage node 112 is high) the buffer circuit 125a helps pull the BL 116a low, thus reducing the probability of upset. In this case, it can be seen that BL 116a is pulled low (to ground in FIG. 2A) through buffer driver transistor 126a and buffer pass transistor 127a which are both on when storage node 112 and WL 124 are high, respectively, and thus couples the BL 116a to VSS source voltage line 148 (at ground). This discharge path through the buffer circuit 125a is in addition to the conventional BL discharge path which is through first cell pass transistor 114 and NMOS pull-down transistor 132, as described above. $\overline{BL}$ 116b has no such discharge path in this case, as the first storage node 111 is low, turning off driver transistor 126b, preventing coupling of 116b to VSS source voltage line 148 (at ground). Thus, the high at node 112 is maintained, further reducing the possibility of upset of cell 200 and providing additional stability to the cell 200 as compared to conventional 8T and 10T cells. If the buffer pass transistor 127a has lower Vt relative to the Vt of the pass transistor 114a, as WL 124 ramps up, the buffer circuit 125a will start discharging the BL 116a before the pass transistor 114a is turned on sufficiently for BL 116a to upset the cell 200. In either case, the BL 116a will discharge faster with the addition of the buffer circuit 125a versus conventional cell designs, thus adding stability to cell 200 as compared to conventional cell designs that lack coupling of the buffer circuit 125a to the BL 116a.

In the case where the second storage node 112 is low (and first storage node 111 is high), the buffer circuit 125b also helps pull the $\overline{BL}$ 116b low, thus reducing the probability of upset. In this case, it can be seen that $\overline{BL}$ 116b is pulled low (to ground in FIG. 2A) through buffer driver transistor 126b and buffer pass transistor 127b, which are both on when storage node 111 and Wk 124 are high, respectively, and thus couples the $\overline{BL}$ 116b to VSS source voltage line 148 (at ground). This discharge path through the buffer circuit 125b is in addition to the conventional discharge path through second cell pass transistor 114b and NMOS pull-down transistor 142, as described above. In this case, BL 116a has no such discharge path, as the second storage node 112 is low and turns off driver transistor 126a, preventing coupling of BL 116a to VSS source voltage line 148 (at ground). Thus the high at node 111 is maintained, further reducing the possibility of upset of cell 200 and adding stability to the cell 200 as compared to conventional 8T and 10T cells. If the buffer pass transistor 127b has lower Vt relative to the Vt of the pass transistor 114b, as WL 124 ramps up, the buffer circuit 125b will start discharging the $\overline{BL}$ 116b before the pass transistor 114b is turned on sufficiently for 116b to upset the cell 200. In either case, the $\overline{BL}$ 116b will discharge faster with the addition of the buffer circuit 125b versus conventional cell designs, thus adding stability to cell 200 as compared to convention cell designs that lack coupling of the buffer circuit 125b to the BL 116b.

As noted above, this stability enhancement provided by buffer circuits 125a and 125b will generally be more effective if the buffer pass transistors 127a and 127b of the buffer circuits 125a and 125b, respectively, have a lower Vt as compared to the Vt of their associated pass transistors 114a and 114b associated with the core storage element 210, such as at least 20 mV, 30 mV, or at least 50 mV lower. As used herein, differences in voltage thresholds expressed as higher or lower Vts, refer to thresholds for the respective devices in the memory cell averaged across the corresponding devices in an array of such cells, averaging out random variation. In the design and the fabrication of the cell 200, for example, the target threshold adjust implant dose for read pass gates 127a, 127b may be lower than the target threshold adjust implant dose for pass gates 114a, 114b so that the nominal Vt for read pass gates 127a and 127b in the memory array is lower as compared to the nominal Vt of the pass gates 114a and 114b in the memory array.

Moreover, as described below relative to FIG. 4A where separate read and write WLs are provided, having a slower rise time signal applied to the gate of pass transistors 114a and 114b as compared to the signal applied to buffer pass transistors 127a and 127b will also generally improve stability by again allowing more time for the buffer circuits 125a and 125b to pull down one of BL 116a and $\overline{BL}$ 116b before the respective one of pass transistors 114a and 114b is turned on sufficiently to possibly upset the cell.

For WRITE operations, one of BL 116a or $\overline{BL}$ 116b is driven (by a write driver, not shown) to force the desired state of the cell when WL 124 is asserted. Optionally, to enhance robustness during a WRITE operation, BL 116 or $\overline{BL}$ 116b can be pre-charged high, and WL 124 can be turned on to establish a low on BL 116 or $\overline{BL}$ 116b for half-selected cells storing a '0' or a '1', respectively; and then boost WL 124 for WRITE into the selected cells with the established voltage on BL 116 or $\overline{BL}$ 116b on the half-selected cells, thus avoiding upset. It is noted that with the improved dynamic stability provided by the buffer circuits 125a and 125b driving BL 116 and $\overline{BL}$ 116b, respectively, the design of the core storage element 210 and cell pass transistors 114a, 114b can be slanted more toward improved WRITE (e.g. relatively stronger (lower Vt) cell pass transistors) compared to a conventional 6T SRAM. Moreover, as described below relative to FIG. 2B, by having separate power supplies for the core storage element 210 in the array and the buffer circuits 125a and 125b, WRITE robustness can also generally be improved as compared to a single VSS supply, such as reducing the potential for read buffer induced contentions problems during WRITE operations.

Figure 2B:
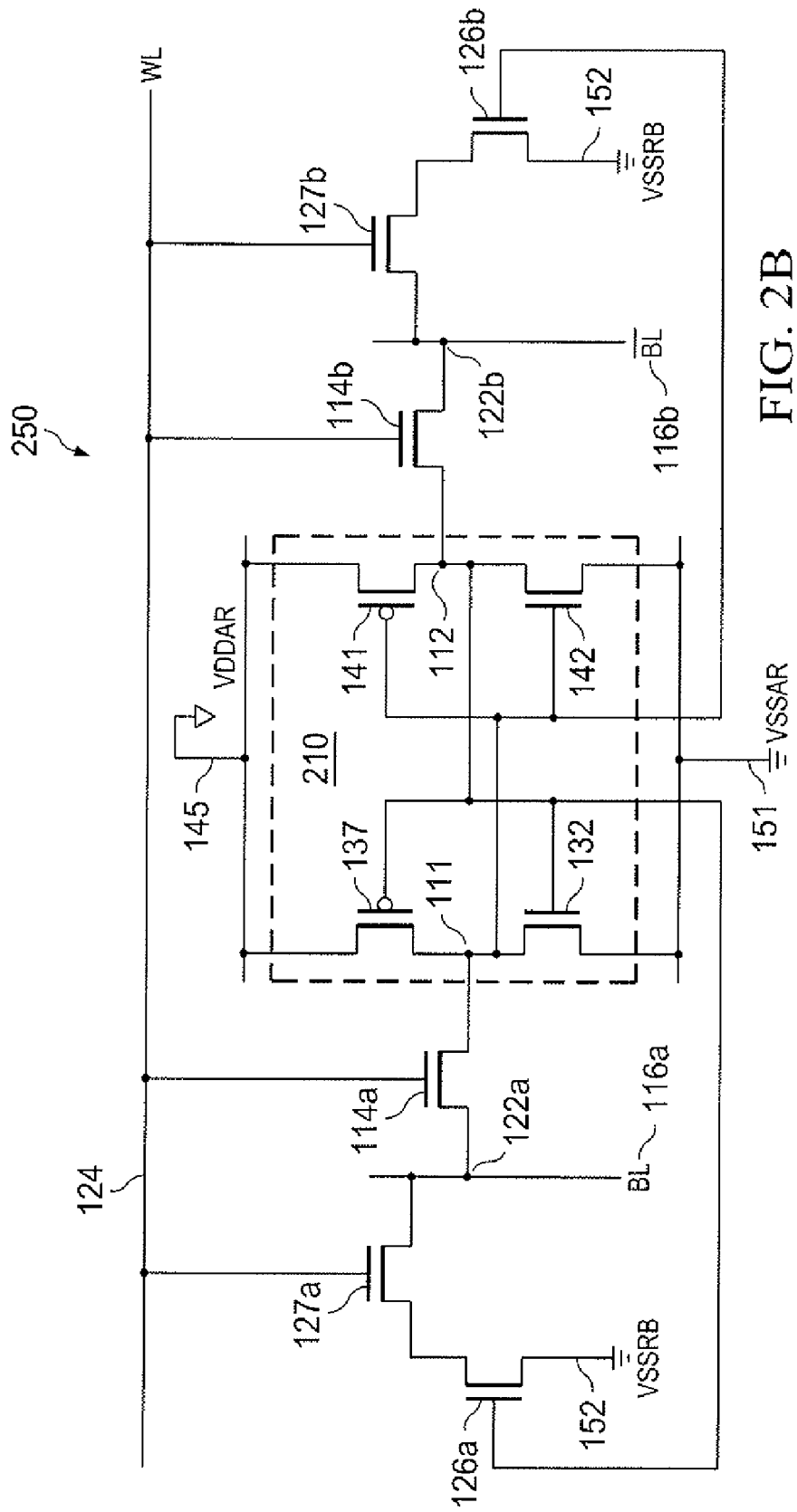
FIG. 2B is a schematic of a 10T cell with common READ/WRITE BL's (BL and $\overline{BL}$) and a common READ/WRITE WL, having separate power supplies for the core storage element and the buffer circuitry, according to an embodiment of the invention.
Figure 2C:
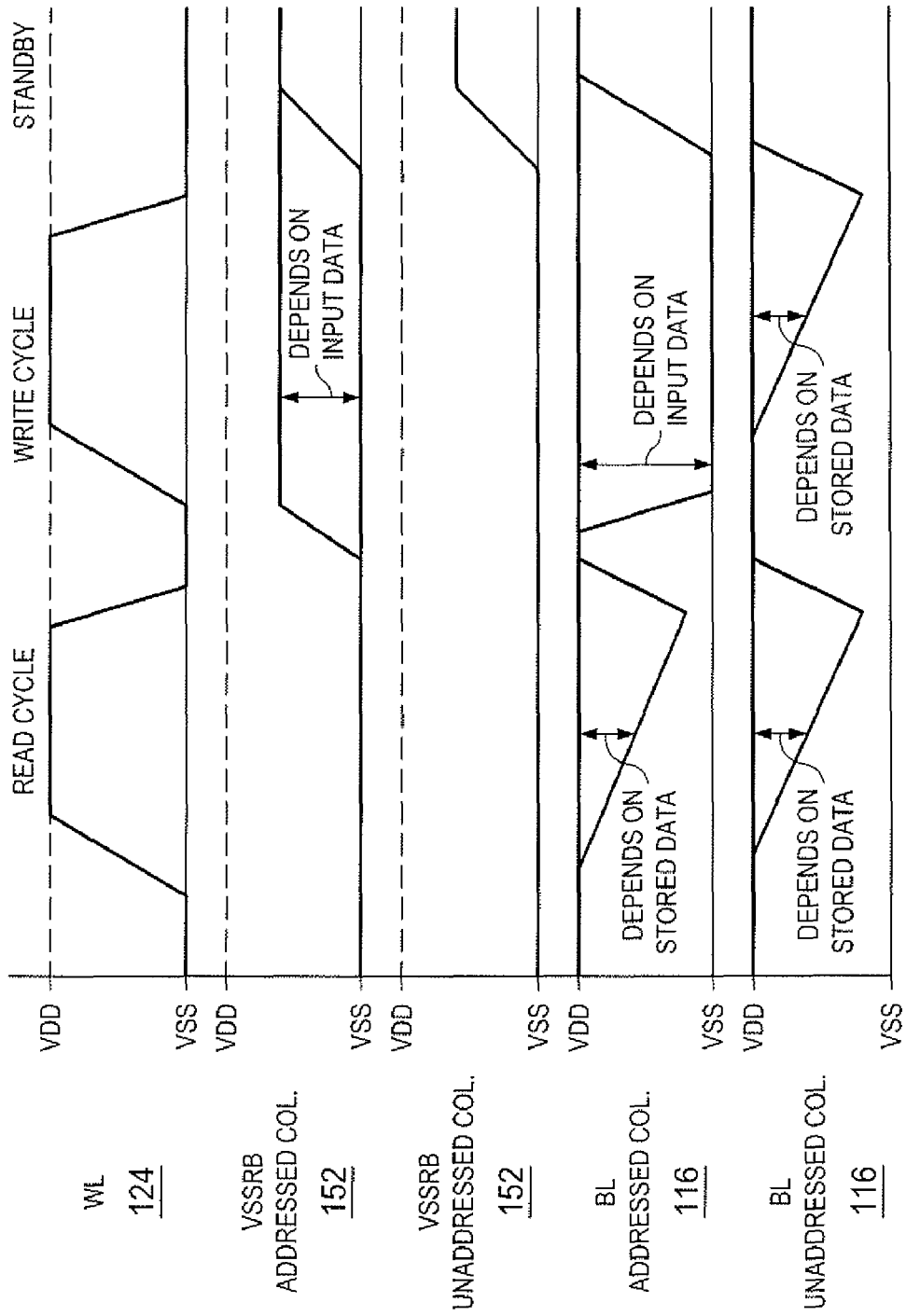
FIG. 2C is a timing diagram showing the operation of a memory cell such as shown in FIG. 2B through a READ cycle, a WRITE cycle and a Standby cycle.

FIG. 2B is a schematic of a 10T cell 250 with common READ/WRITE BL's (BL 116a and $\overline{BL}$ 116b) and common READ/WRITE WL 124, having separate power supplies for cells 250 in the memory array (VSSAR 151) and the buffer circuit 125 (VSSRB 152), according to an embodiment of the invention. FIG. 2C is a timing diagram showing the operation of memory cell 250 through a READ cycle, a WRITE cycle and a standby cycle. During a READ cycle, the voltage on BL 116 for both addressed columns and unaddressed columns may be lowered, depending on the stored data. During a WRITE cycle, VSSRB 152 can be floated and allowed to rise above VSS in columns being written (addressed columns) to reduce possible contentions with the buffer circuit 125. VSSRB 152 is shown kept low (at VSS) for unaddressed columns in write to help the stability of the half addressed cells in the array. While in standby, for low IDDQ (low power) operation, VSSRB 152 can be floated as shown.

Cell 250 can be operated at lower power by raising (more positive) VSSAR 151 while in active mode. This will also generally improve Vtrip and thus the WRITE margin, with little or no degradation of stability (SNM). A possible down side to raising VSSAR 151 is that one of driver transistors 126a and 126b may not be fully turned off on the '0' side. Nevertheless, there will generally still be a strong differential between read current and leakage current. An alternative is to lower the VDD for the array, shown as VDDAR 145, but this can cause a greater degradation of SNM, and also reduce Iread.

Figure 2D:
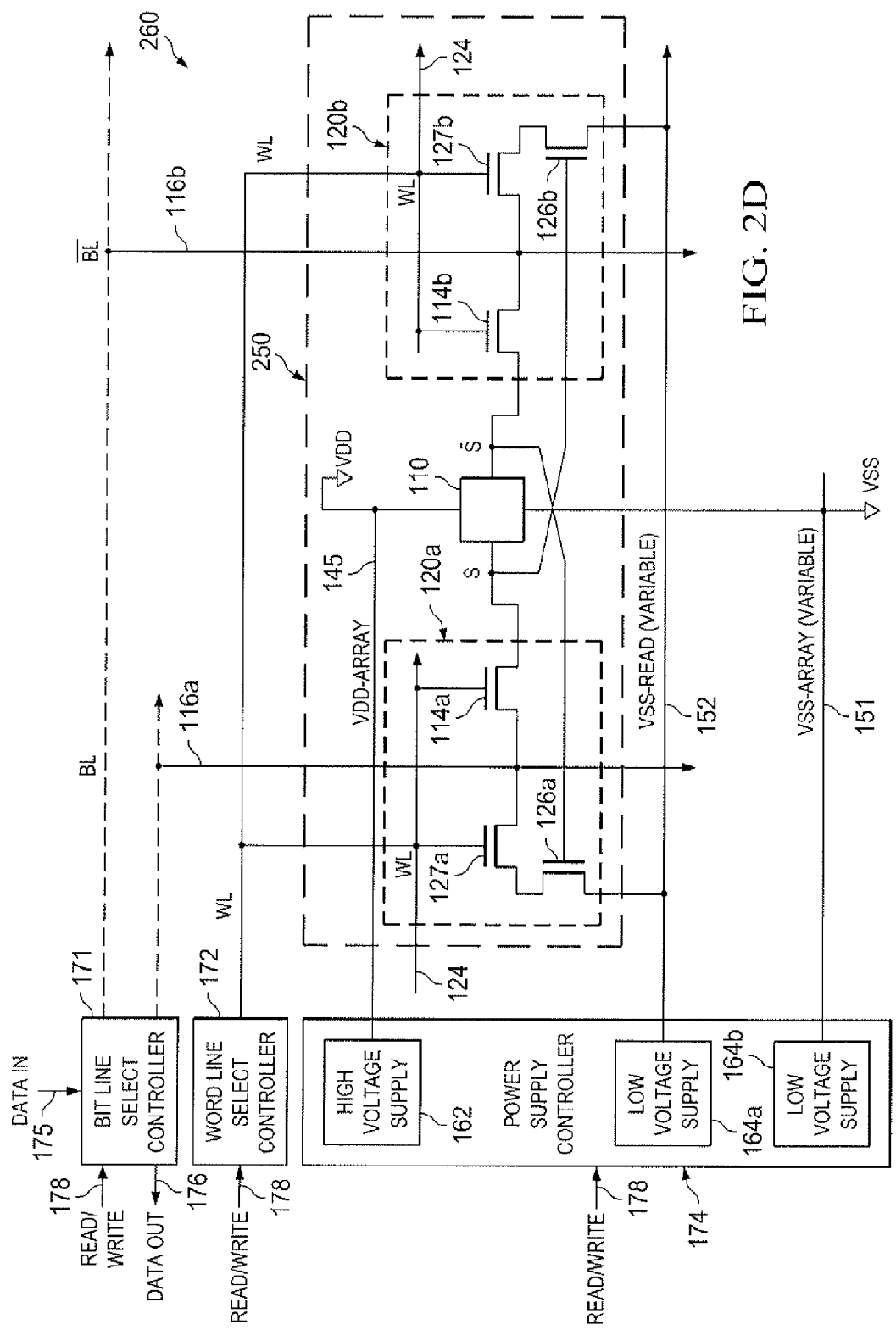
FIG. 2D is a schematic of an integrated circuit comprising a 10T cell with common READ/WRITE BL's (BL and $\overline{BL}$) and a common READ/WRITE WL, including a power supply controller for providing different supply voltages to the core storage element and the buffer circuitry of the 10T cell, according to an embodiment of the invention.

FIG. 2D is a schematic of a memory array 260 comprising at least one 10T cell 250, as previously described with respect to FIG. 2B, with common READ/WRITE BL's (BL 116 and $\overline{BL}$ 116b) and common READ/WRITE WL 124. Memory array 260 also includes a power supply controller 174 for providing different supply voltages to the core storage elements 110 of the memory cells 250 of the memory array 260. Power supply controller 174 receives a high supply voltage 162 and low supply voltage 164. For VSS, VSS-ARRAY 151, which can be varied by the supply controller 174, is provided for the core storage elements 110 of the array 260 and VSS-READ 152, which can be varied by the supply controller 174, is provided for the buffer circuit formed by the buffer pass transistor 127 and the buffer driver 126. For VDD, power supply controller 174 provides VDD for the array 260, shown as VDD-ARRAY 145, which can also be a variable VDD.

Memory array 260 comprises a bit line/column select controller 171 that receives a read/write signal 178 at its input indicating whether a read or write operation is to be performed and the column address. The bit line select controller 171 also receives a data in signal 175 in the case of a write operation and provides a data out signal 176 in the case of a read operation. An output of the BL controller 171 is also coupled to BL 116a and $\overline{BL}$ 116b. Memory array 260 also comprises a WL select controller 172 that receives the read/write signal 178 at its input indicating whether a READ or WRITE operation is to be performed and the row or write line address. The output of the WL controller 172 is coupled to WL 124.

Figure 2E:
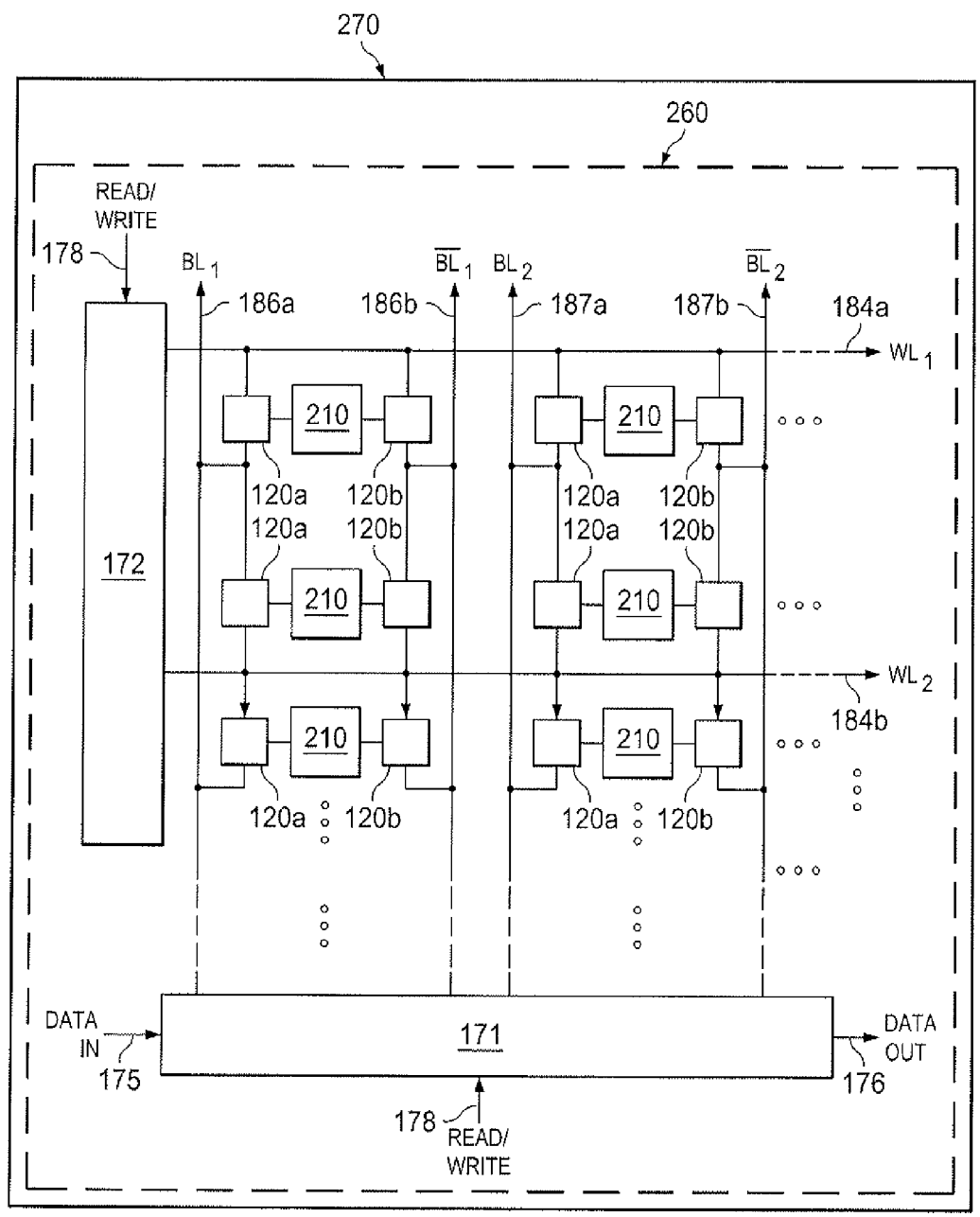
FIG. 2E is a schematic of an integrated circuit comprising a memory array having a plurality of memory cells with common READ/WRITE BL's (BL and $\overline{BL}$) and a common READ/WRITE WL's, including a word line select controller and a bit line select controller for reading and writing data to the memory array, according to an embodiment of the invention.

FIG. 2E is a schematic of an IC 270 comprising a memory array 260 having a plurality of 10T cells 210, 120a, 120b with common READ/WRITE BL's (BLs 186a, 187a and $\overline{BL}$'s 186b, 187b) and a common READ/WRITE WL's (WL1 and WL2, including a word line select controller and a bit line select controller for reading and writing data to the memory array, according to an embodiment of the invention.

As described above with respect to FIG. 2D, memory array 260 in IC 270 comprises a bit line select controller 171 that receives a read/write signal 178 at its input indicating whether a READ or WRITE operation is to be performed and the column or bit line address. The bit line select controller 171 also receives a data in signal 175 in the case of a write operation and provides a data out signal 176 in the case of a read operation. An output of the BL controller 171 is also coupled to BLs 186a or 187a and $\overline{BL}$'s 186b or 187b, respectively. IC 270 also comprises a WL select controller 172 that receives the read/write signal 178 at its input indicating whether a READ or WRITE operation is to be performed. The output of the WL controller 172 is coupled to WLs 184a and 184b.

Figure 2F:
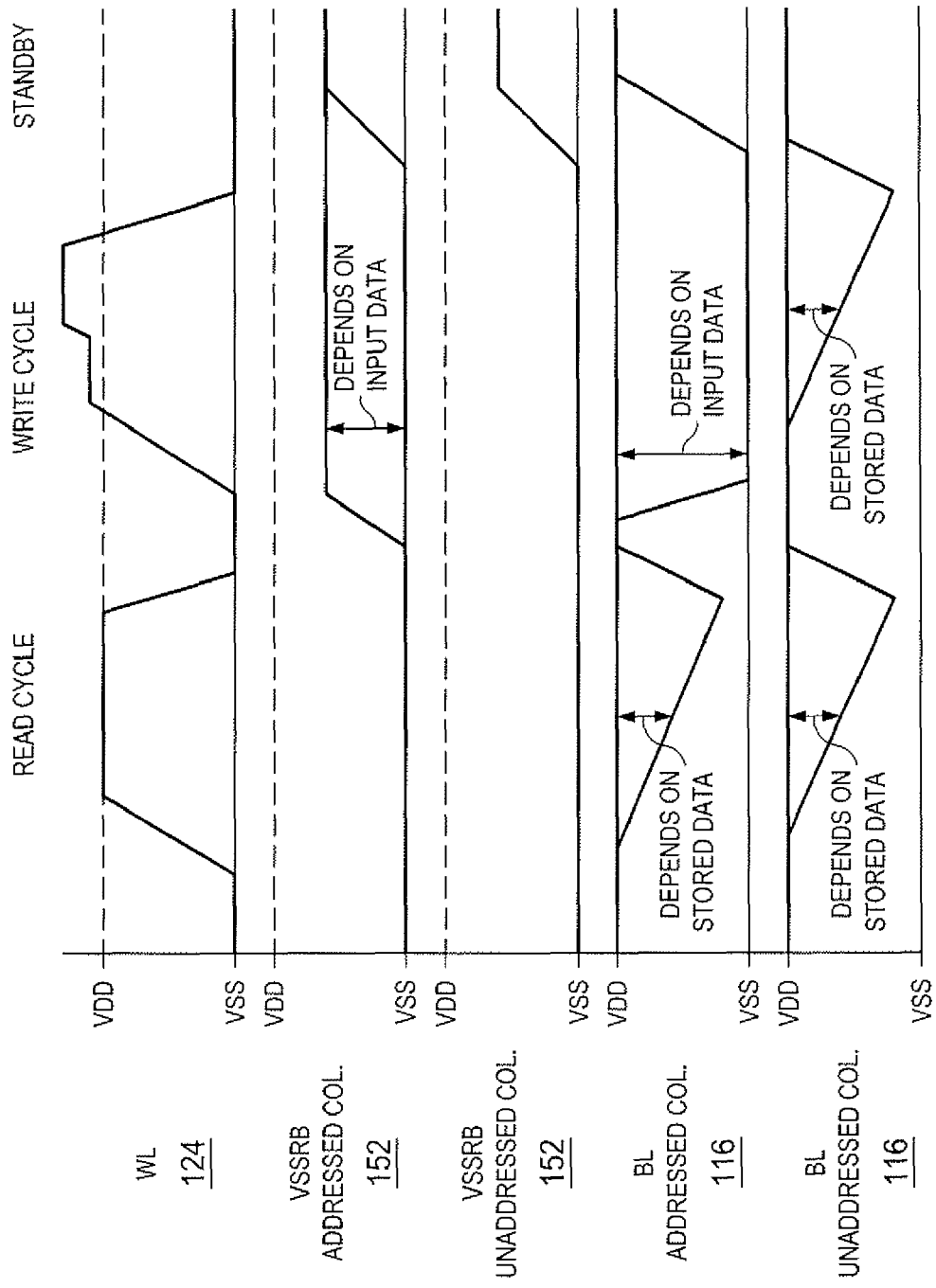
FIG. 2F is a timing diagram showing the operation of a memory cell such as shown in FIG. 2B through a READ cycle, a WRITE cycle and a Standby cycle, according to a first embodiment that realizes a delayed boosted WL level during a WRITE operation.

In one embodiment of the invention, a more robust WRITE operation can be achieved by using two or more different voltage levels on the WL during a WRITE operation. This is conceptually illustrated in FIG. 2F. FIG. 2F is a timing diagram showing the operation of a memory cell, such as cells 200 or 250, through a READ cycle, a WRITE cycle and a Standby cycle, in a first embodiment that realizes a delayed boosted WL level during a WRITE operation. As shown in FIG. 2F, during a WRITE operation the READ/WRITE WL 124 shown in FIGS. 2A and 2B can transition initially to a first voltage level and later during the WRITE operation transition to a second voltage level that is a higher as compared to the first voltage level. Boosting the WL voltage in the WRITE cycle after some delay time allows an initial establishment of a voltage on the BL's of the half addressed cells which can improve the stability of the half selected cells while the delayed boost of the WL can lead to a more robust WRITE.

Figure 2G:
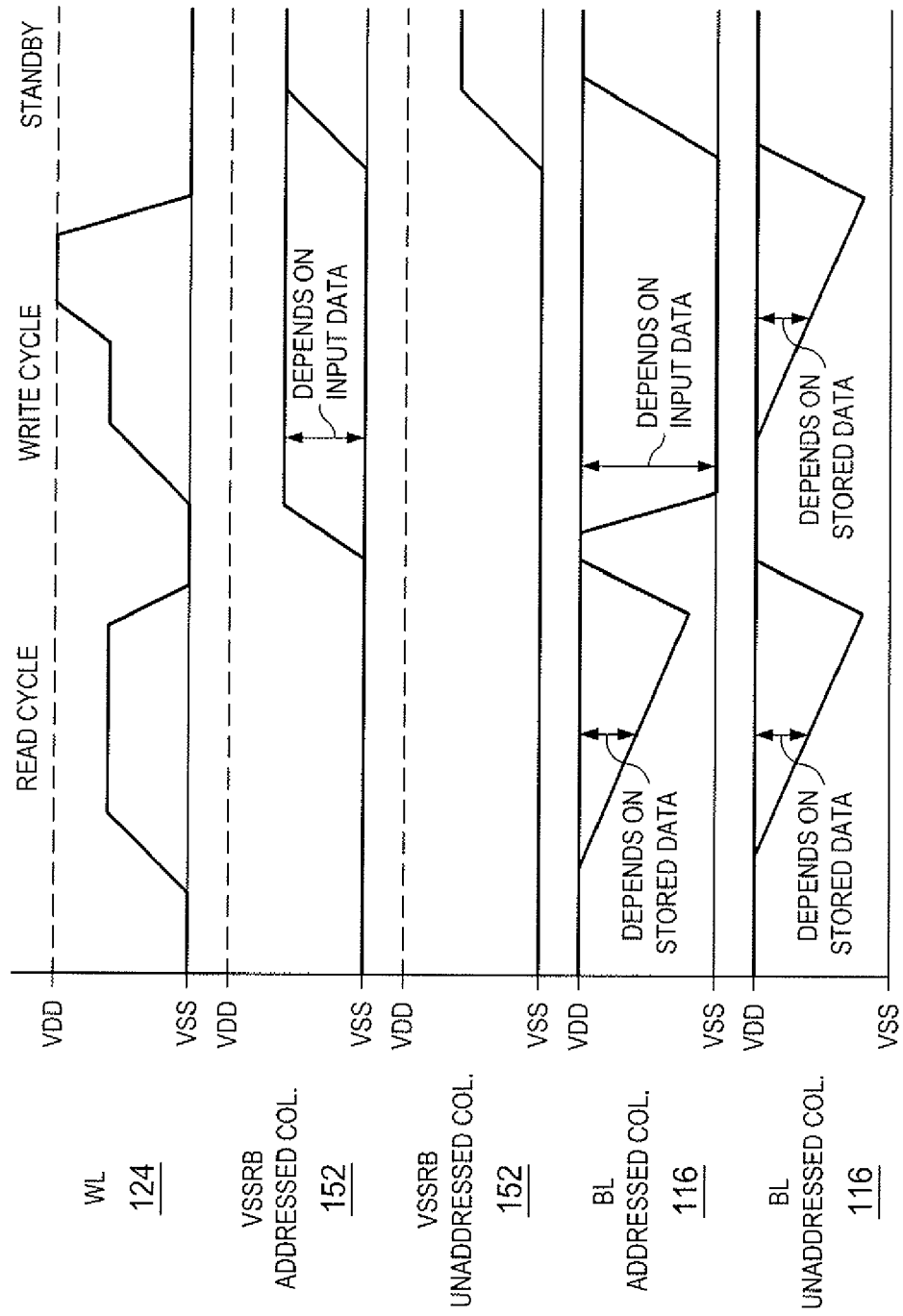
FIG. 2G is a timing diagram showing the operation of a memory cell such as shown in FIG. 2B through a READ cycle, a WRITE cycle and a Standby cycle, according to a second embodiment of the invention that realizes a delayed boosted WL level during a WRITE operation.

FIG. 2G is a timing diagram showing the operation of a memory cell according to an embodiment of the invention through a READ cycle, a WRITE cycle and a Standby cycle, in a second embodiment that realizes a delayed boosted WL, level during a WRITE operation. During the WRITE operation shown the WL 124 initially rises to a level below VDD, then after a delay sufficient for the establishment of a stable voltage on the BL's of the half addressed cells, WL, rises to VDD.

Figure 3A:
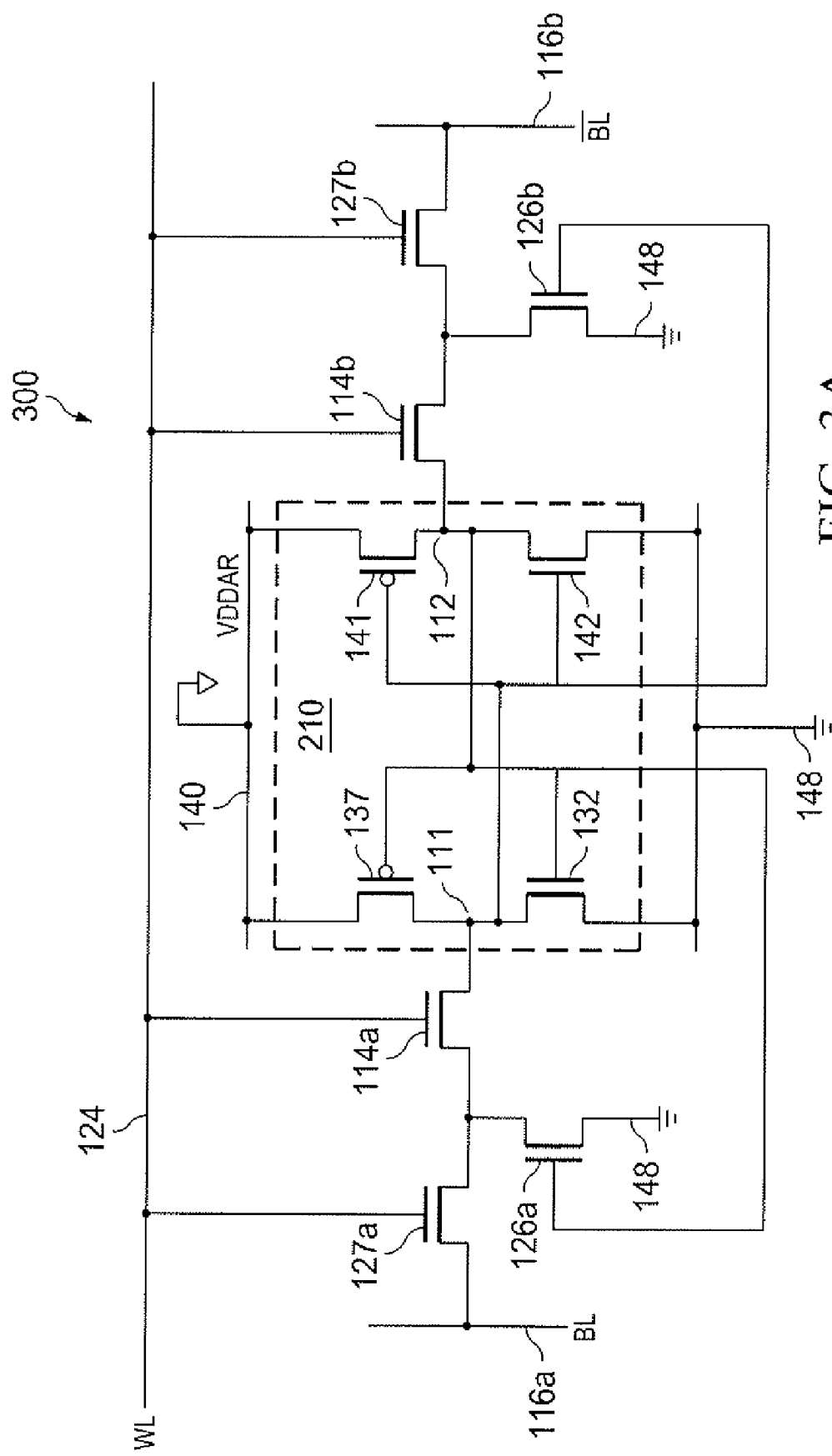
FIG. 3A is a schematic of a 10T cell with common READ/WRITE BL's (BL and -$\overline{BL}$-) and a common READ/WRITE WL, in an alternate topology for improved stability, according to another embodiment of the invention.

FIG. 3A is a schematic of a 10T cell 300 with a common READ/WRITE BL's (BL 116a and $\overline{BL}$ 116b) with common READ/WRITE WL 124, in an alternate topology for generally improved stability, according to another embodiment of the invention. As shown in FIG. 3A BL 116a and $\overline{BL}$ 116b are now connected to the drains of buffer pass transistors 127a and 127b, respectively. The source of buffer pass transistors 127a and 127b are now connected to the drain of buffer driver transistors 126a and 126b, respectively. For cell 300, the first storage node 111 of core storage element 210 is separated from the BL 116a by both pass transistors (127a and 114a). Similarly, the second storage node 112 of core storage element 210 is separated from the 116b by both pass transistors (127b and 114b). This arrangement generally improves SNM but can degrade Vtrip. Such a trade-off may be desirable in certain applications. However, the layout for this configuration is generally not amenable to being as compact as for the cell configuration with the BL 116a and $\overline{BL}$ 116b at the BL nodes 122a and 122b, respectively, as shown in FIGS. 2A and 2B.

Figure 3B:
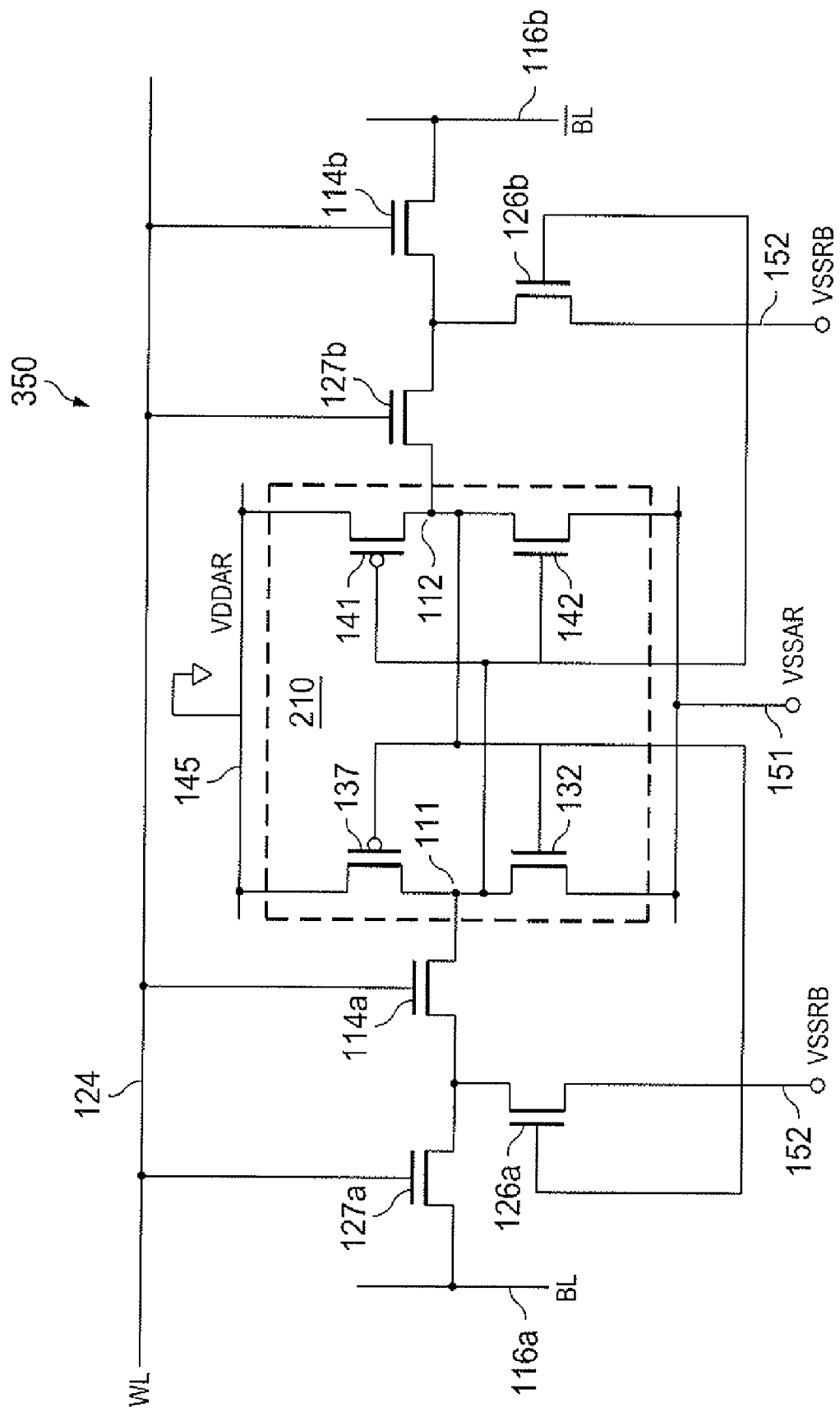
FIG. 3B is schematic of a 10T cell with common READ/WRITE BL's (BL and $\overline{BL}$) and a common READ/WRITE WL, in the alternate topology for improved stability shown in FIG. 3A, having separate power supplies for the core storage element and the buffer circuitry, according to an embodiment of the invention.

FIG. 3B is schematic of a 10T cell 350 having the alternate topology for improved stability cell shown in FIG. 3A, having separate VSS power supplies for the 4T core storage element 210 (VSSAR 151) and the buffer circuits 125a and 125b (VSSRB 152), according to an embodiment of the invention. A power supply controller, such as power supply controller 174 shown in FIG. 2D, can be provided to provide variable levels for VSSAR 151, VSSRB 152, and VDDAR 145.

Figure 4A:
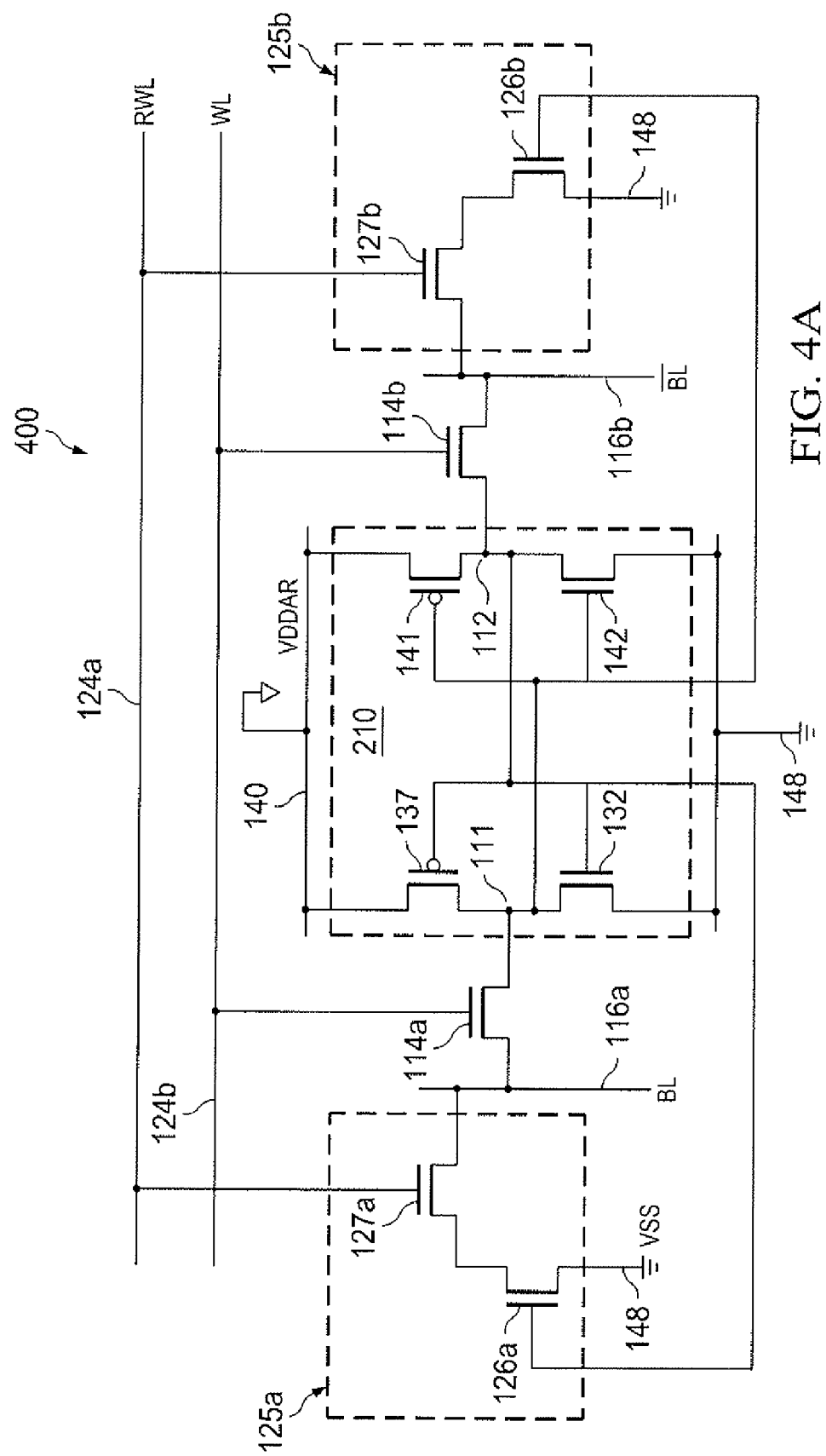
FIG. 4A a schematic of a 10T cell with common READ/WRITE BL's (BL and $\overline{BL}$) and separate READ and WRITE WLs, according to an embodiment of the invention.
Figure 4B:
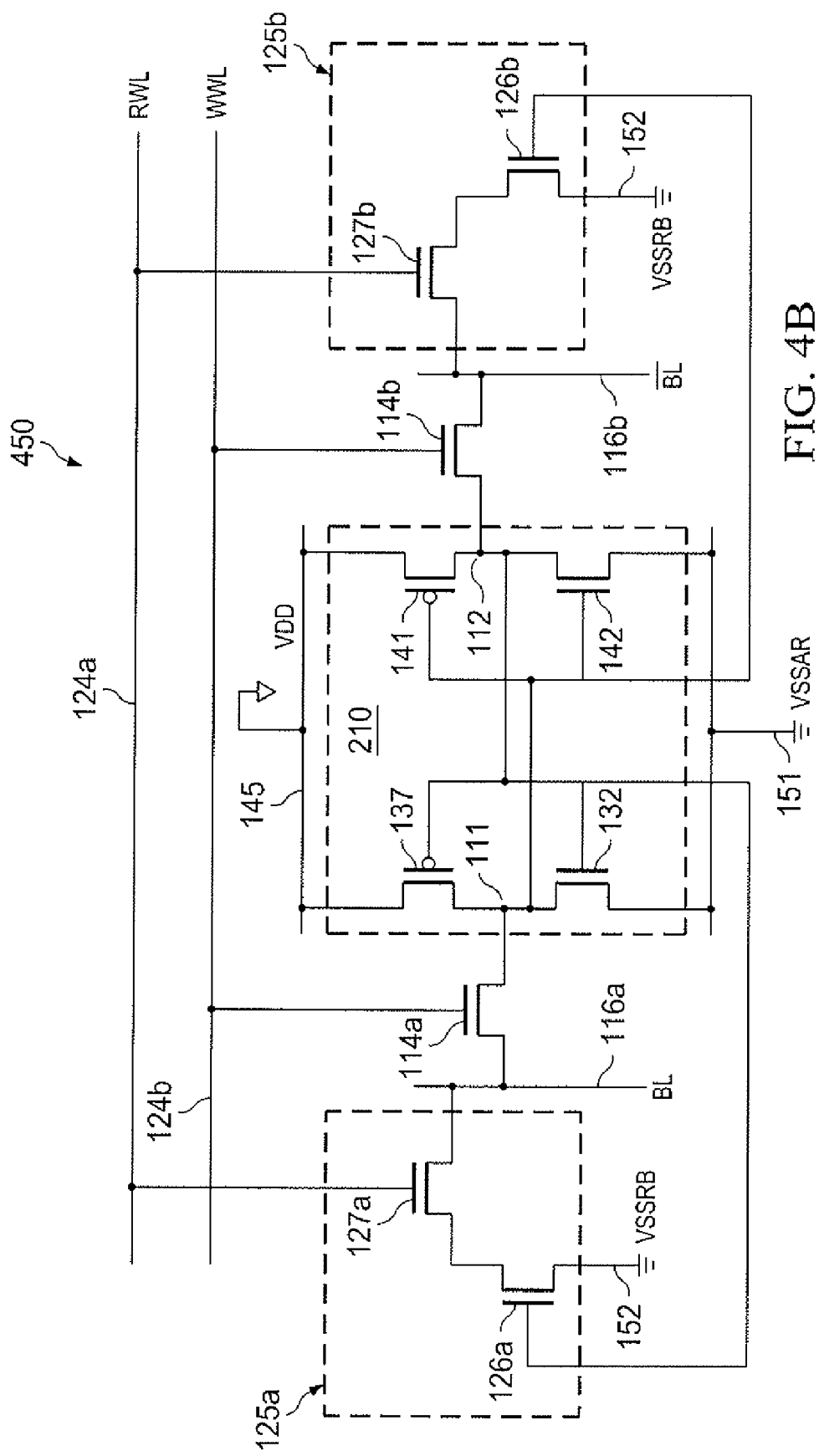
FIG. 4B is schematic of a 10T cell with common READ/WRITE BL's (BL and -$\overline{BL}$-), with separate READ and WRITE WLs, having separate power supplies for the core storage element and the buffer circuitry, according to an embodiment of the invention.

FIG. 4A a schematic of a 10T cell 400 with common READ/WRITE BL's (BL 116a and $\overline{BL}$ 116b), with separate common READ WL (RWL) 124(a) and WRITE WL (WWL) 124(b), according to an embodiment of the invention. FIG. 4B is schematic of a 10T cell 450 with common READ/WRITE BL's (BL 116 and 116b) and separate common WL's (RWL 124(a) and WWL 124(b)), having separate VSS power supplying the 4T core storage element 210 (VSSAR 151) and the buffer circuits 125a and 125b (VSSRB 152), according to an embodiment of the invention. A power supply controller, such as power supply controller 174 shown in FIG. 2D, can be provided to provide variable levels for VSSAR 151, VSSRB 152, and VDDAR 145.

Figure 4C:
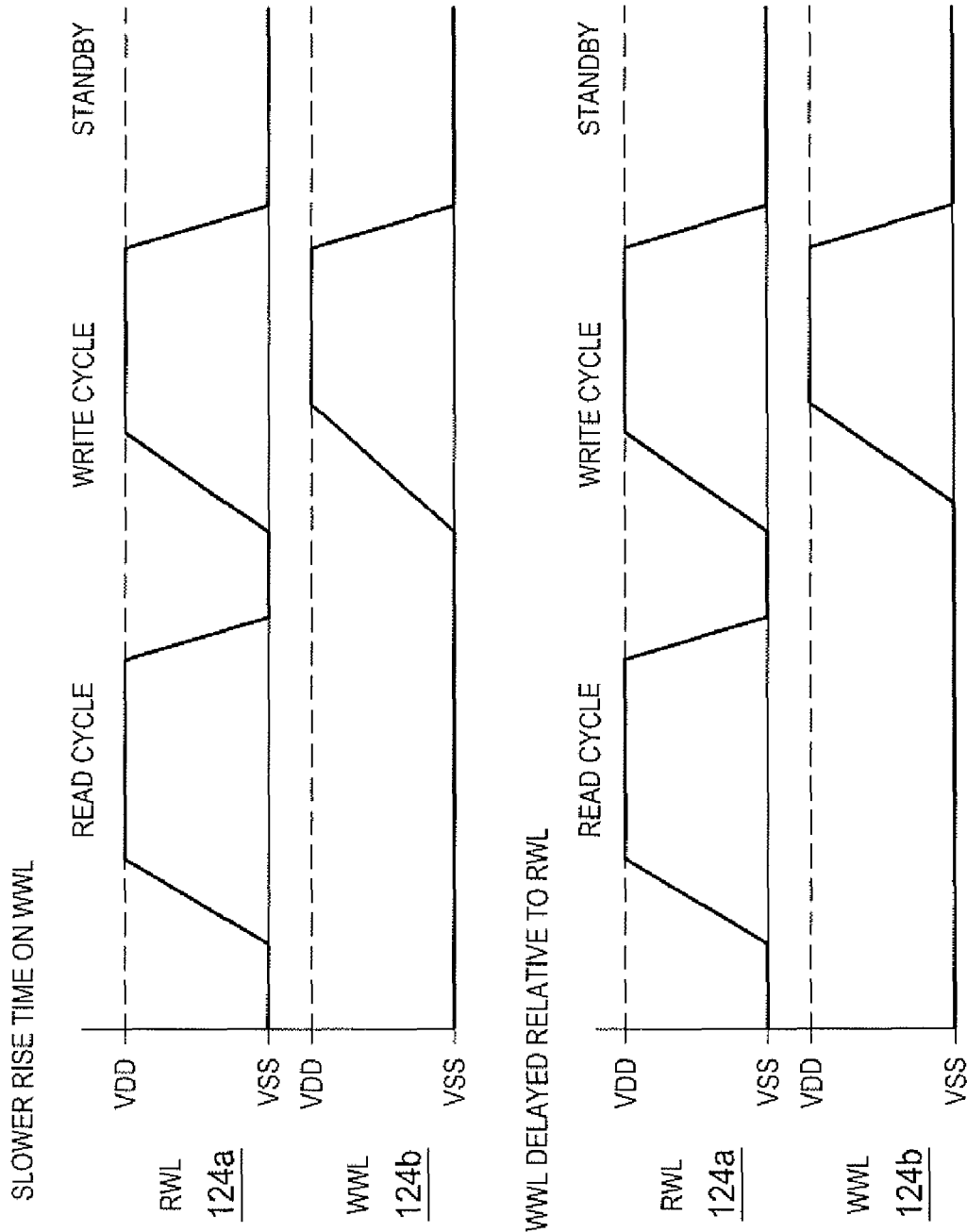
FIG. 4C is a timing diagram showing the operation of a memory cell with a single READ/WRITE BL and separate READ and WRITE WLs, such as shown in FIGS. 4A and 4B, through a READ cycle, a WRITE cycle and a Standby cycle.

FIG. 4C is a timing diagram showing the operation of memory cell 400 or 450 through a READ cycle, a WRITE cycle and a STANDBY cycle. WRITE cycles are shown for both the WWL 124(b) being slower as compared to the RWL 124(a), and for the WWL 124(b) being delayed in time as compared to the RWL 124(a). For READ, RWL 124(a) is shown asserted, while WWL 124(b) is shown not asserted, for both the slower rise time on WWL 124(b) embodiment and the WWL 124(b) delayed relative to the RWL 124(a) embodiment. As a result, there is generally no danger of cell 400 or 450 being upset by BL 116a or $\overline{BL}$ 116b on RE, AD because the pass gates 114a and 114b is off.

For WRITE, several options exist for operation. A first option is to assert only the WRITE WL 124(b). Although this is a simple option, there is generally no benefit derived from read buffers 125a or 125b for stabilizing the half selected cells during write. A second option is to assert both the READ WL 124(a) and WRITE WL 124(b), optionally with the VSS for the read buffers 125a and 125b floated for the selected columns in the array. This option provides the benefit of the either read buffer 125a driving the BL 116a 116 or read buffer 125b 125 driving the $\overline{BL}$ 116b in the half selected cells, reducing the probability of upsetting the half selected cells. Optionally, as shown in the top timing diagram of FIG. 4C, the rise time of WWL 124(b) can be longer as compared to the rise time of RWL 124(a). Alternatively, the assertion of the write WL 124(b) can be delayed relative to assertion of the READ WL 124(a) as shown in the bottom timing diagram of FIG. 4C.

Although not shown, another alternative write option is to first assert the RWL 124(a), then de-assert RWL 124(a), leaving differential on BL 116a and $\overline{BL}$ 116b, then assert the WWL 124(b). Optionally there can be some overlap of the WWL 124(b) turning on while the RWL 124(a) is turning off. It is noted that there is generally no need to de-assert the RWL 124(a) if the VSS is floated for the buffer circuits 125a or 125b in columns selected for WRITE as enabled by the cell 450.

Figure 5A:
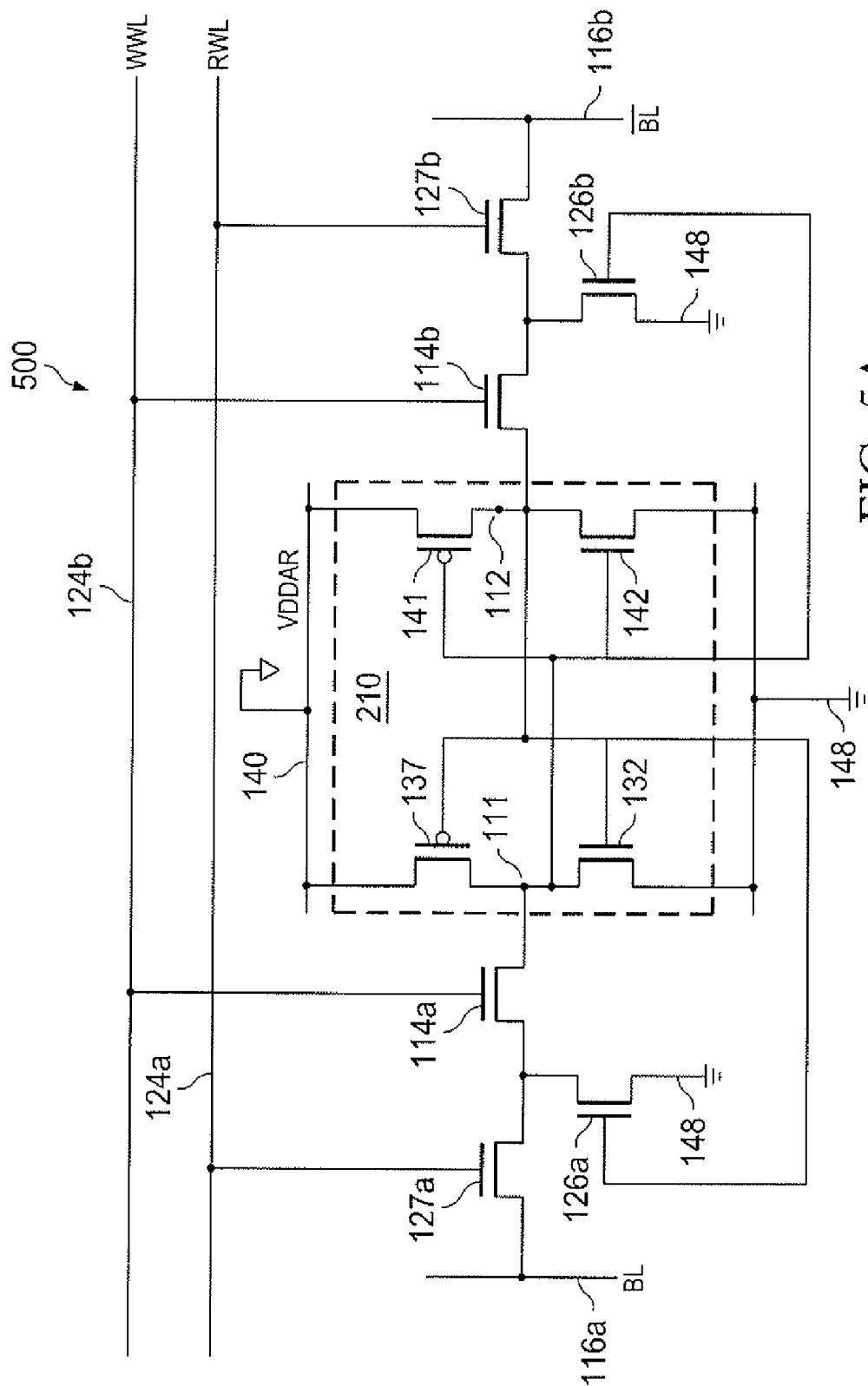
FIG. 5A is a schematic of a 10T cell with common READ/WRITE BL's (BL and -$\overline{BL}$-), with separate READ and WRITE WLs, in the alternate topology shown in FIG. 2A for improved stability, according to another embodiment of the invention.

FIG. 5A is a schematic of a 10T cell 500 with common READ/WRITE BL's (BL 116a and $\overline{BL}$ 116b) and separate common WL's (RWL 124(a) and WWL 124(b)), in an alternate topology for improved stability, according to another embodiment of the invention. Analogous to cell 300 shown in FIG. 3A, the BL 116a for cell 500 is now connected to the drain of buffer pass transistor 127a and the source of buffer pass transistor 127a is now connected to the drain of buffer driver transistor 126a. Similarly, the BL 116b for cell 500 is now connected to the drain of buffer pass transistor 127b and the source of buffer pass transistor 127b is now connected to the drain of buffer driver transistor 126b. Thus, for cell 500, like cell 300, the first storage node 111 of core storage element 210 is separated from the BL 116a by pass transistors 127a and 114a and the second storage node 112 of core storage element 210 is separated from the $\overline{BL}$ 116b by pass transistors 127b and 114b.

Figure 5B:
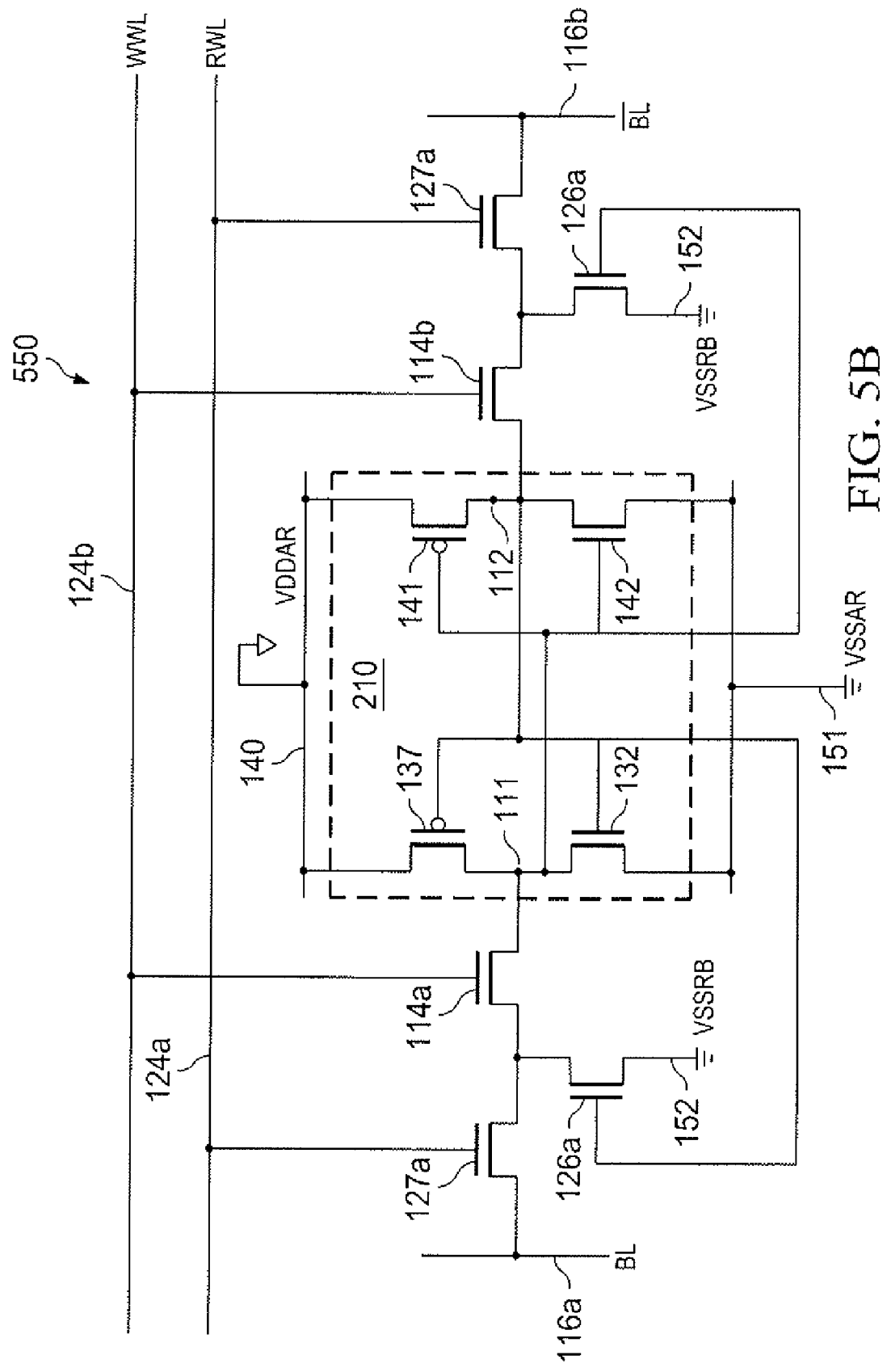
FIG. 5B is a schematic of a 10T cell with common READ/WRITE BL's (BL and -$\overline{BL}$-), with separate READ and WRITE WLs, in the alternate topology for improved stability shown in FIG. 5A, having separate power supplies for the core storage element and the buffer circuitry, according to an embodiment of the invention.

FIG. 5B is a schematic of a 10T cell 550 in the alternate topology for improved stability shown in FIG. 5A, with common READ/WRITE BL's (BL 116a 116 and $\overline{BL}$ 116b) and separate common WL's (RWL 124(a) and WWL 124(b)), having separate VSS power supplying the 4T core storage element 210 (VSSAR 151) and the buffer circuits (VSSRB 152), according to an embodiment of the invention.

Embodiments of the invention provide several significant advantages. For example, embodiments of the invention generally provide a better Iread/IDDQ/area trade-off compared to conventional 6T, 7T, 8T or 10T cells. For example, embodiments of the invention generally provide a more compact layout compared to conventional 8T or 10T cell designs. One reason for improved compactness is the reduction of BLs due to the common BL/$\overline{BL}$ aspect of embodiments of the invention, and optionally the common Wk aspect of the invention. Another reason is that read and write-back is no longer generally required, and as a result, the associated peripheral circuitry to sense the read bit line (RBL) and drive the WRITE bitline (WBL) for half selected cells in a WRITE cycle in conventional 8T or 10T cell comprising circuits is no longer generally required.

Embodiments of the invention also generally provide better stability relative to conventional 7T, 8T, or 10T cells that as described above have separate READ and WRITE BL's. For the embodiments of the invention with separate READ) and WRITE WL's (e.g. cell 400 shown in FIG. 4A), as described above, the stabilization of unaddressed columns in WRITE is simpler than the read-and-write-back required for conventional designs that have separate READ and WRITE BL's.

These are but a few examples. Accordingly, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

I claim:

1. An integrated circuit (IC) including an array of memory cells, said memory cell comprising:
    a core storage element having a first storage node and a complementary second storage node;
    a first cell pass transistor coupled to said first storage node and a second cell pass transistor coupled to said second storage node, wherein a first bitline is coupled to a first BL node in a source drain path of said first cell pass transistor, and wherein a second BL is coupled to a second BL node in a source drain path of said second cell pass transistor;
    a first buffer circuit comprising a first buffer pass transistor and a first buffer driver transistor, wherein said first buffer pass transistor and said first buffer driver transistor are coupled to said source drain path of said first cell pass transistor, wherein said first buffer pass transistor is between said first BL node and said buffer driver transistor, and wherein a gate of said first buffer driver transistor is coupled to said second storage node;
a second buffer circuit comprising a second buffer pass transistor and a second buffer driver transistor, wherein said second buffer pass transistor and said second buffer driver transistor are coupled to a source drain path of said second cell pass transistor, wherein said second buffer pass transistor is between said second BL node and said buffer driver transistor, and wherein a gate of said first buffer driver transistor is coupled to said second storage node; and
a first wordline coupled to said first and second cell pass transistors;
wherein said first cell pass transistor and first buffer pass transistor are connected in series between said first storage node and said first BL node, and said first cell pass transistor is between said first buffer driver transistor and said first storage node, and wherein said second cell pass transistor and second buffer pass transistor are connected in series between said second storage node and said second BL node, and said second cell pass transistor is between said second buffer driver transistor and said second storage node.

2. The IC of claim 1, wherein said storage element comprises first and second cross coupled inverters, wherein said first cross coupled inverter provides said first storage node and said second cross coupled inverter provides said second storage node.

3. The IC of claim 1, wherein said first and second cell pass transistors and said first and second buffer pass transistors are commonly controlled by said first WL.

4. The IC of claim 1, further comprising a second WL coupled to said first and said second buffer pass transistors.

5. The IC of claim 1, wherein an average threshold voltage for said first and said second buffer pass transistors in said array is at least 20 mV lower as compared to an average threshold voltage of said first and said second cell pass transistors in said array.

6. The IC of claim 1, wherein said integrated circuit comprises separate VSS supply lines operable for supplying different VSS levels for said core storage elements and said first and second buffer circuits.

7. The IC of claim 6, further comprising a power supply controller having a plurality of outputs for coupling to each of said separate VSS supply lines.

8. An integrated circuit (IC) including an array of SRAM memory cells, said SRAM memory cells comprising:
a core SRAM storage element comprising first and second cross-coupled inverters, said first inverter having a first storage node and said second inverter having a second storage node;
a first cell pass transistor coupled to said first storage node and a second cell pass transistor coupled to said second storage node, wherein a first bitline is coupled to a first BL node in a source drain path of said first cell pass transistor, and wherein a second BL is coupled to a second BL node in a source drain path of said second cell pass transistor;
a first buffer circuit comprising a first buffer pass transistor and a first buffer driver transistor, wherein said first buffer pass transistor and said first buffer driver transistor are coupled to said source drain path of said first cell pass transistor, wherein said first buffer pass transistor is between said first BL node and said buffer driver transistor, and wherein a gate of said first buffer driver transistor is coupled to said second storage node;
a second buffer circuit comprising a second buffer pass transistor and a second buffer driver transistor, wherein said second buffer pass transistor and said second buffer driver transistor are coupled to a source drain path of said second cell pass transistor, wherein said second buffer pass transistor is between said second BL node and said buffer driver transistor, and wherein a gate of said first buffer driver transistor is coupled to said second storage node; and
a first wordline coupled to said first and second cells pass transistors;
wherein said first cell pass transistor and first buffer pass transistor are connected in series between said first storage node and said first BL node, and said first cell pass transistor is between said first buffer driver transistor and said first storage node, and wherein said second cell pass transistor and second buffer pass transistor are connected in series between said second storage node and said second BL node, and said second cell pass transistor is between said second buffer driver transistor and said second storage node.

9. The IC of claim 8, wherein said first and second cell pass transistors and said first and said second buffer pass transistors are commonly controlled said first WL.

10. The IC of claim 8, further comprising a second WL coupled to said first and said second buffer pass transistors.

11. A method of operating a memory array comprising a plurality of memory cells, said memory cells comprising core storage elements having a first storage node and a complementary second storage node, a first cell pass transistor coupled to said first storage node, a second cell pass transistor coupled to said second storage node, a first buffer circuit comprising a first buffer pass transistor and a first driver transistor coupled to a source drain path of said first cell pass transistor, and a second buffer circuit comprising a second buffer pass transistor and a second driver transistor coupled to a source drain path of said second cell pass transistor, wherein a first bitline is coupled to a first BL node in said source drain path of said first cell pass transistor, wherein a second BL is coupled to a second BL node in said source drain path of said second cell pass transistor, wherein said first buffer pass transistor is between said first BL node and said first driver transistor, wherein said second buffer pass transistor is between said second BL node and said second driver transistor, and a first wordline is coupled to said first and said second cell pass transistors, the method comprising:
modifying BL signal levels on at least one of said first and said second BL nodes during at least one operation of said memory cell; and
floating or raising a VSS power supply line level coupled to a source of said first and second driver transistors for addressed columns of said memory cells in said array while keeping said VSS power supply line level low to a source of said first and second driver transistors for an unaddressed column of said memory cells in said array during a WRITE operation;
wherein a first of said BL signal levels on said first BL node is modified using said first buffer circuit, and wherein a second of said BL signal levels on said second BL node is modified using said second buffer circuit.

12. The method of claim 11, wherein each of said memory cells further comprise a second WL coupled to a gate of said first buffer pass transistor and a gate of said second buffer pass transistor, further comprising during a WRITE operation asserting said first and said second WL, wherein a slower rise time signal is applied to said first WL as compared to a rise time of a signal applied to said second WL.

13. The method of claim 11, wherein each of said memory cells further comprise a second WL coupled to a gate of said first buffer pass transistor and a gate of said second buffer pass transistor, further comprising during a WRITE operation asserting said second WL before said first WL.

14. The method of claim 11, wherein said first WL is a gate of said first cell pass transistor, a gate of said second cell pass transistor, a gate of said first buffer pass transistor, and a gate of said second buffer pass transistor, further comprising during a WRITE operation said first WL transitioning initially to a first voltage level and later during said WRITE operation transitioning to a second voltage level that is a higher as compared to said first voltage level.

15. The method of claim 11, wherein each of said memory cells further comprise a second WL coupled to a gate of said first buffer pass transistor and a gate of said second buffer pass transistor, further comprising during a READ operation asserting said second WL while not asserting said first WL.

16. The method of claim 11, further comprising the step of applying a different supply voltage to said storage element as compared to said first and said second buffer circuits during at least one operation of said memory cell.

17. The method of claim 11, further comprising the step of floating a VSS power supply line coupled to a source of said driver while said memory cells are in STANDBY.

18. The method of claim 11, further comprising the step of lowering a VDD level on a supply line coupled to said core storage elements in addressed columns of said memory cells in said array during a WRITE operation.

* * * * *